(12) United States Patent
Oladeji

(10) Patent No.: US 7,793,611 B2
(45) Date of Patent: Sep. 14, 2010

(54) FILM GROWTH SYSTEM AND METHOD

(75) Inventor: Isaiah O. Oladeji, Gotha, FL (US)

(73) Assignee: Sisom Thin Films LLC, Orlando, FL (US)

( * ) Notice: Subject to any disclaimer, the term of this patent is extended or adjusted under 35 U.S.C. 154(b) by 0 days.

(21) Appl. No.: 12/656,000

(22) Filed: Jan. 12, 2010

(65) Prior Publication Data

US 2010/0116201 A1  May 13, 2010

Related U.S. Application Data

(62) Division of application No. 12/151,562, filed on May 7, 2008, now Pat. No. 7,700,161.

(51) Int. Cl.
*B05C 11/00* (2006.01)

(52) U.S. Cl. .................. 118/667; 118/679; 118/682; 118/725; 118/428; 427/446; 427/447; 427/448; 427/455; 438/104; 438/483; 438/758; 438/761; 438/767; 438/779; 438/781; 438/792

(58) Field of Classification Search .................. None
See application file for complete search history.

(56) References Cited

U.S. PATENT DOCUMENTS

| | | | |
|---|---|---|---|
| 5,545,394 A | 8/1996 | Doxsee | |
| 6,537,845 B1 | 3/2003 | McCandless et al. | |
| 6,794,288 B1 | 9/2004 | Kolics et al. | |
| 7,235,483 B2 | 6/2007 | Ivanov | |
| 2003/0181040 A1 | 9/2003 | Ivanov et al. | |
| 2004/0084143 A1 | 5/2004 | Ivanov et al. | |

OTHER PUBLICATIONS

Oladeji et al., Optimization of chemical bath deposited CdS thin films, J. Electrochem. Soc. 144, No. 7, 2342-46 (1997).
Ito et al.,Preparation of ZnO thin films using the flowing liquid film method, Thin Solid Films 286, 35-6 (1996).
Oladeji et al., A study of the effects of ammonium salts on chemical bath deposited zinc sulfide thin films, Thin Solid Films 339, 148-53 (1999).
Oladeji et al., Comparative study of CdS thin films deposited by single, continuous, and multiple dip chemical processes, Thin Solid Films 359, 154-9 (2000).
Oladeji et al., Synthesis and processing of CdS/ZnS multilayer films for solar cell application, Thin Solid Films 474, 77-83 (2005).

*Primary Examiner*—Savitri Mulpuri
*Assistant Examiner*—Yasser A Abdelaziez
(74) *Attorney, Agent, or Firm*—Robert J. Lauf

(57) ABSTRACT

An apparatus for depositing a solid film onto a substrate from a reagent solution includes a reservoir of solution maintained at a low temperature to inhibit homogeneous reactions. The solution contains multiple ligands to control temperature stability and shelf life. The chilled solution is periodically dispensed onto a substrate positioned in a holder having a raised peripheral structure that retains a controlled volume of solution over the substrate. The solution is periodically replenished so that only the part of the solution directly adjacent to the substrate is heated. A heater maintains the substrate at an elevated temperature at which the deposition of a desired solid phase from the solution may be initiated. The apparatus may also dispense excess chilled solution to cool various components within the apparatus and minimize nucleation of solids in areas other than on the substrate. The apparatus is particularly suited to forming films of II-VI semiconductors.

13 Claims, 10 Drawing Sheets

FILM GROWTH SYSTEM AND METHOD

CROSS REFERENCE TO RELATED APPLICATION

This application is a Divisional Application of U.S. patent application Ser. No. 12/151,562 entitled "Film Growth System and Method" filed by the present inventor on May 7, 2008 now U.S. Pat. No. 7,700,161, the entire disclosure of which is incorporated herein by reference.

BACKGROUND OF THE INVENTION

1. Field of the Invention

The invention pertains to a system and method for chemically coating a variety of surfaces with semiconductor materials, metals, or insulators for various applications including electronics.

2. Description of Related Art

Numerous coating processes are commonly employed in industrial applications, including electroless chemical, chemical vapor and physical vapor depositions. Physical vapor deposition is commonly used in semiconductor manufacturing applications, often employing expensive vacuum techniques in order to sustain a relatively high film growth rate. Many such processes, while performed at high temperatures (e.g., greater than 300° C.), are non-equilibrium, often resulting in non-stoichiometric proportions. Also, due to the nature of the deposition processes, the deposited films often include relatively high defect densities. In the case of semiconducting devices, such high defect levels can limit electrical performance characteristics. In semiconductor device fabrication wherein p-n junctions are formed in a partial vacuum by depositing one film over a second film or a substrate of different conductivity type, the conventional evaporative and sputtering techniques may provide unsatisfactory film qualities. As an alternative, relatively more expensive techniques such as Chemical Vapor Deposition (CVD), Molecular Beam Epitaxy (MBE), pulsed laser deposition, and atomic layer epitaxy, are useful, especially with formation of III-V compound semiconductor materials, but satisfactory deposition processes have not been available for fabrication of thin film II-VI compound semiconductor materials.

Chemical bath deposition (CBD) is a low cost, low temperature technique which, under certain limited conditions, can provide high quality thin film growth of desired stoichiometry. However, the technique has provided low growth rates, e.g., 20 to 30 Å/minute, and the grown film thickness per bath cycle is limited to around 1000 Å rendering it non-suitable for volume manufacture. Generally, for products, such as solar diodes and light emitting diodes, film thicknesses on the order of 3,000 to 20,000 Å are needed. With traditional chemical bath deposition techniques, efforts to increase film growth rates typically result in degradation of film quality. Thicker films of higher quality, however, can be attained by cyclic deposition of stacked relatively thin layers. This, of course, is time consuming and generally can be an expensive endeavor, wherein relatively expensive chemicals are wasted due to deposition of film materials on unwanted surfaces such as the equipment.

Conventional CBD is carried out with the source solution held at slightly elevated temperature, typically ~85° C. [see, for example, Oladeji and Chow, "Optimization of Chemical Bath Deposited Cadmium Sulfide Thin Films," *J. Electrochem. Soc.* 144 (7): 2342-46 (1997)]. In this situation, heterogeneous nucleation of the CdS film on the substrate must compete with homogeneous nucleation of colloidal CdS particles within the stirred reactant solution. Particulates represent not only a waste of reagents but also a source of defects in the deposited film.

A process for depositing ultra-thin semiconductors is taught by McCandless et al. in U.S. Pat. No. 6,537,845. The process uses a premixed liquid containing Group IIB and VIA ionic species and a complexing agent. The solution is applied to a substrate heated to a temperature from 55 to 95° C., forming an ultra-thin (100-500 Å) coating. For thicker coatings, the process can be repeated. The process taught in '845 suffers from several noteworthy shortcomings. First, using a single complexing agent (generally taught to be $NH_4OH$) prevents adequate process control: at a low concentration the solution is so unstable that unwanted homogeneous nucleation can occur, whereas at high concentration the activation energy required to form the film becomes so high that the claimed substrate temperature may not be able to overcome it to cause a film growth. Second, the thickness of film that can be grown in a single step is very small, so to grow a film of 0.1 μm or greater, multiple cycles are needed and this will tend to introduce greater concentrations of defects. This will also make the process cumbersome and less manufacturing friendly.

Films have also been prepared using the flowing liquid film process as taught by Ito et al. [Preparation of ZnO thin films using the flowing liquid film method, *Thin Solid Films* 286: 35-6 (1996)]. The deposition process involved the reaction of zinc chloride and urea at 70° C. according to the reaction:

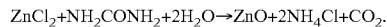

$$ZnCl_2 + NH_2CONH_2 + 2H_2O \rightarrow ZnO + 2NH_4Cl + CO_2.$$

The use of $NH_2CONH_2$ as a single ligand will result in excessive homogenous reaction, and ZnO film growth takes place mostly by particulate adsorption. ZnO so formed is less transparent and of little or no practical use. Furthermore, the side of the substrate next to the incoming solution gets the full dose of the solution, hence high growth rate, whereas the side of the substrate at solution exit receives the least dose, hence low growth rate. As a result, the film non-uniformity will increase with increasing substrate size. Since all the flowing solution sees the heat provided by the substrate, film growth will take place on the substrate plus any part of the system on contact with the hot growth solution, leading to material waste. If the particulate generation happens in the enclosed chamber, these could be trapped and get adsorbed unto the substrate, leading to poor quality film.

In U.S. Pat. App. Pub. 2003/0181040 as taught by Ivanov et al., films have also been prepared on semiconductor substrates using a sealed chamber filled with growth solution maintained at high pressure about 2 atmosphere and temperature at 0 to 25% below the boiling point of the solution. The use of high pressure is needed to keep the rigid substrate in place, and the cost associated with this is not trivial. The relatively large volume of solution in the chamber is heated completely by the heater located outside the chamber or in the substrate holder or both. This arrangement forces the hot growth solution to be in contact with the substrate and substantial part of the chamber system, and results in wasteful film growth on unwanted areas. The latter will also increase the cost of keeping the chamber clean to prevent particle build up. Subjecting a relatively large volume of growth solution in chamber at high pressure and temperature will not only encourage the desired heterogeneous reaction responsible for film growth but also substantially increase the unwanted homogenous reaction; the latter will lead to fast depletion and waste of material, and this will in turn increase the production cost.

These facts were recognized by Ivanov, who through U.S. Pat. No. 7,235,483, attempted to minimize the material waste, by having the substrate heated and cooled instantaneously, and using the high temperature only during the growth regime when it is needed, especially during the bulk film growth step. For Cu interconnect, the focus of that work, where 500 Å or less Cu metal seed and CoWP Cu capping layer are needed, the bulk deposition step may be short enough to prevent quick depletion of chemicals. However, for semiconductor film deposition needed for solar cells and other optoelectronics applications where the required film thickness is more than 1000 Å, the high temperature bulk deposition step time will be longer and the instantaneous heating and cooling will not help. Generally, in electroless semiconductor film deposition catalyzed substrate surface is not required. One would therefore expect the growth rate on the substrate as well as other parts of the chamber system in contact with the hot solution to be about same; the consequence of this is substantial material waste. This will make the chamber cleanliness even a much bigger challenge. The operating cost and waste management in using this system for semiconductor film manufacturing will be prohibitive. It should also be noted that this approach is only applicable to rigid substrates; flexible substrates cannot be used.

OBJECTS AND ADVANTAGES

Objects of the invention include the following: providing a bath deposition apparatus capable of depositing a selected phase on a substrate while minimizing homogeneous nucleation of the same or similar phase within the bulk of the fluid bath; providing a bath deposition apparatus capable of depositing films having improved physical, chemical, optical, or electrical properties; providing a bath deposition apparatus that is more easily controlled; providing a bath deposition apparatus that uses reagents more efficiently; providing a bath deposition apparatus that allows localized heating of a relatively small volume of the bath while maintaining the remainder of the bath at a relatively lower temperature; providing a method for bath deposition that is more easily controlled; providing a method for bath deposition that minimizes homogeneous nucleation within the bath; providing a method for bath deposition capable of depositing films of selected II-VI compounds, other compounds, or metals having improved properties. These and other objects will become apparent on reading the specification in conjunction with the accompanying drawings

SUMMARY OF THE INVENTION

In accordance with one aspect of the invention, an apparatus for depositing a solid film onto a substrate from a reagent solution comprises:

a reservoir of reagent solution maintained at a first temperature at which homogeneous reactions are substantially inhibited within the reagent solution;

a fluid dispenser configured to dispense a controlled flow of the reagent solution at the first temperature;

a substrate holder configured to hold the substrate in a position to receive at least a portion of the controlled flow of reagent over a selected area of the substrate, the substrate holder further including a raised structure peripheral to the selected area whereby a controlled volume of reagent solution may be maintained upon the substrate and replenished at a selected rate; and, a heater disposed beneath the substrate, the heater configured to maintain the substrate at a second temperature, higher than the first temperature, at which the deposition of a desired solid phase from the reagent solution may be initiated.

In accordance with another aspect of the invention, a method for depositing a solid film onto a substrate from a reagent solution comprises the steps of:

a. providing a supply of reagent solution maintained at a first temperature at which homogeneous reactions are substantially inhibited within the reagent solution;

b. dispensing a controlled flow of the reagent solution from a dispenser assembly;

c. positioning the substrate to receive at least a portion of the controlled flow of reagent over a selected area of the substrate;

d. providing a raised structure peripheral to the selected area whereby a controlled volume of the reagent solution may be maintained upon the substrate; and, e. heating the substrate and the controlled volume of reagent solution upon the substrate to a second temperature, higher than the first temperature, whereby deposition of a desired solid phase from the reagent solution may be initiated.

In accordance with another aspect of the invention, an apparatus for forming semiconductor material films comprises:

a processing chamber including a fluid dispenser configured to uniformly supply a reagent solution onto a selected area of the surface of a substrate positioned on a substrate holder assembly including a temperature-controlled platen configured to effect a temperature-dependent reaction at the substrate surface, the substrate holder assembly further comprising a raised structure peripheral to the selected area whereby a controlled volume of reagent solution may be maintained upon the substrate and replenished at a selected rate;

a temperature-controlled process solution reservoir wherein the reagent solution may be held at a sufficiently low temperature to inhibit homogeneous reactions; and, a delivery system configured to supply a controlled flow of the reagent solution through the dispenser to the substrate surface whereon the temperature-dependent reaction forms the semiconductor film.

BRIEF DESCRIPTION OF THE DRAWINGS

A clear conception of the advantages and features of the invention, and of the components and operation of exemplary systems provided with the invention, will become more readily apparent by referring to the drawings accompanying and forming part of this specification, in which like numerals designate like elements in several views. The features are not necessarily drawn to scale.

DETAILED DESCRIPTION OF THE INVENTION

Figure 1:
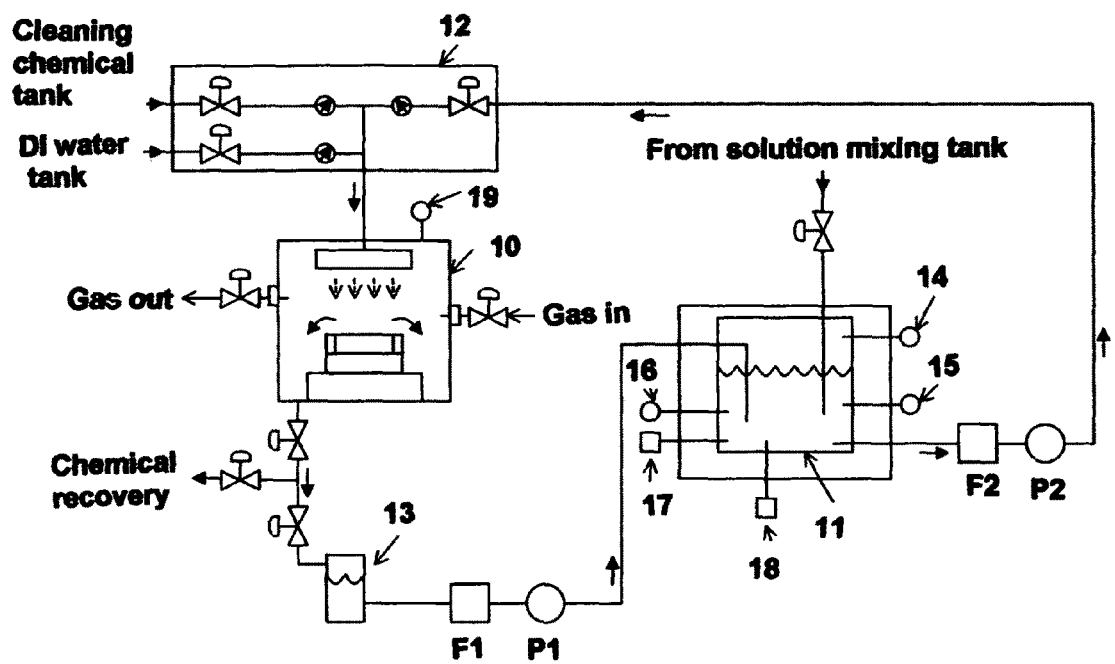
FIG. 1 illustrates schematically the general flow of reagents in accordance with one aspect of the invention.
Figure 2:
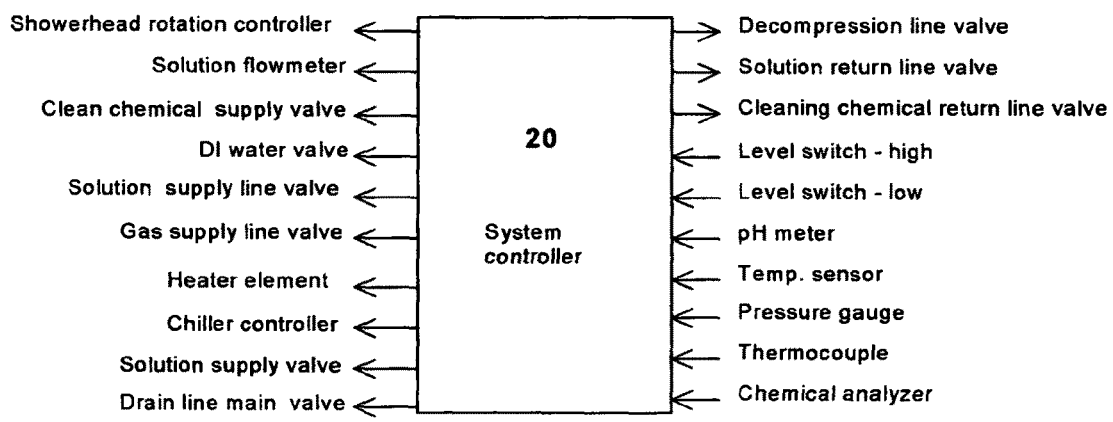
FIG. 2 illustrates typical process inputs and outputs for a system controller suitable for use with the present invention.

There has been a need for a chemical system that can create high quality films, e.g., semiconductor films, at high formation rates, while providing a relatively uniform film thickness across the entire substrate surface over which the film is formed. In accordance with several embodiments of the invention, such a high quality semiconductor film is formed by a replacement reaction wherein the system provides a continuous or replenishable supply of chemical processing solution. In several examples, the solution reacts about the surface of a heated substrate. The substrate temperature may be controlled to exhibit a substantially uniform temperature across the surface. That is, temperature differentials along the surface over which the film is formed are limited in order to effect a substantially constant reaction rate along the surface, thereby assuring a relatively uniform film growth rate. Further, the pH and composition of the solution may be continuously monitored and maintained to improve the stability of the process and, hence, the quality of the deposited film, e.g., stoichiometry, defect density, uniformity and consistency of dopant distribution. The system may be operated above atmospheric pressure to increase the rate of film growth.

FIGS. 1-4 illustrate simplified schematic diagrams of a Film Growth System (FGS). In some of the examples that follow, the illustrated films comprise II-VI compound materials but the system is useful for a wide variety of film compositions and numerous other embodiments are contemplated in order to effect film growth according to the principles described herein. The system of FIGS. 1-4 and other embodiments are shown with specific geometries but these are merely exemplary. For example, the shapes of substrates, chambers, chamber interiors, shower heads and numerous other features described herein may be readily modified without departing from the spirit and scope of the invention. It is also to be understood that, throughout the written description and the figures, numerous like components common to different embodiments are designated with similar names and, in such cases, descriptions and functions described for a component with reference to one or more embodiments are applicable to similarly named components of other embodiments.

As used herein the term film forming surface means the surface of a workpiece, e.g., a substrate, over which a desired film is grown. As described below, the film forming surface may be the surface of a substrate that faces a showerhead in order to receive a direct flow or spray of chemical processing solution as illustrated for several embodiments herein. Further, the illustrated embodiments are described with reference to an exemplary orientation wherein the reaction chamber receives the workpiece or substrate in a mounting such that the workpiece is in a level position with respect to a major surface, e.g., during the film growth process the surface over which a film is grown is level. The illustrated chambers are also depicted as having bases, showerheads and lids which are positioned in a level orientation during film growth processes. However, other orientations of the substrate and various components may be preferred for other embodiments and applications without departing from the spirit and scope of the invention.

The FGS of FIG. 1 includes a reaction chamber 10 and a chilled solution reservoir 11 for retaining and chilling chemical processing solution which may be held at a stable, low temperature preferably less than about 25° C. and more preferably in the range of 10 to 25° C. or lower. At the preferred temperatures, homogeneous reactions are substantially inhibited and the solution has adequate shelf life and minimal homogeneous precipitation of particulates. The FGS further includes a solution supply subsystem for moving the chemical processing solution (while maintained at a low temperature) from the reservoir to the chamber, and a solution return subsystem for cycling partially spent solution from the chamber back to the solution reservoir. The solution supply subsystem includes a supply line filter F2 for removing particulates from the solution, a supply line pump P2 for supplying the solution to the reaction chamber, and a liquid control panel 12 under the direction of a system controller. The liquid control panel 12 includes a series of conventional valves and flow controllers for selectably injecting and varying flows of liquids into the processing chamber 10. For example, the liquid control panel 12 may deliver the chemical processing solution and one or more chemicals for chamber cleaning or for cleaning of the surface of the substrate over which a desired film is grown.

Chemical processing solution from the reservoir is supplied to the liquid control panel by the supply line pump after passing through the supply line filter F2. The solution return subsystem includes a plurality of valves for controlling flows of various liquids from the processing chamber, a return line reservoir 13, a return line filter F1 for removing particulates from the returning solution, and a return line pump P1 for sending the filtered solution to the process solution reservoir 11. Proper control and regulation of the liquid flowing through the liquid control panel is effected by the flow controllers under the direction of the system controller. Solution reservoir 11 may optionally include such familiar components as high and low level switches 14, 15, temperature sensor 16, pH meter 17, and chemical analyzer 18.

Figure 3:
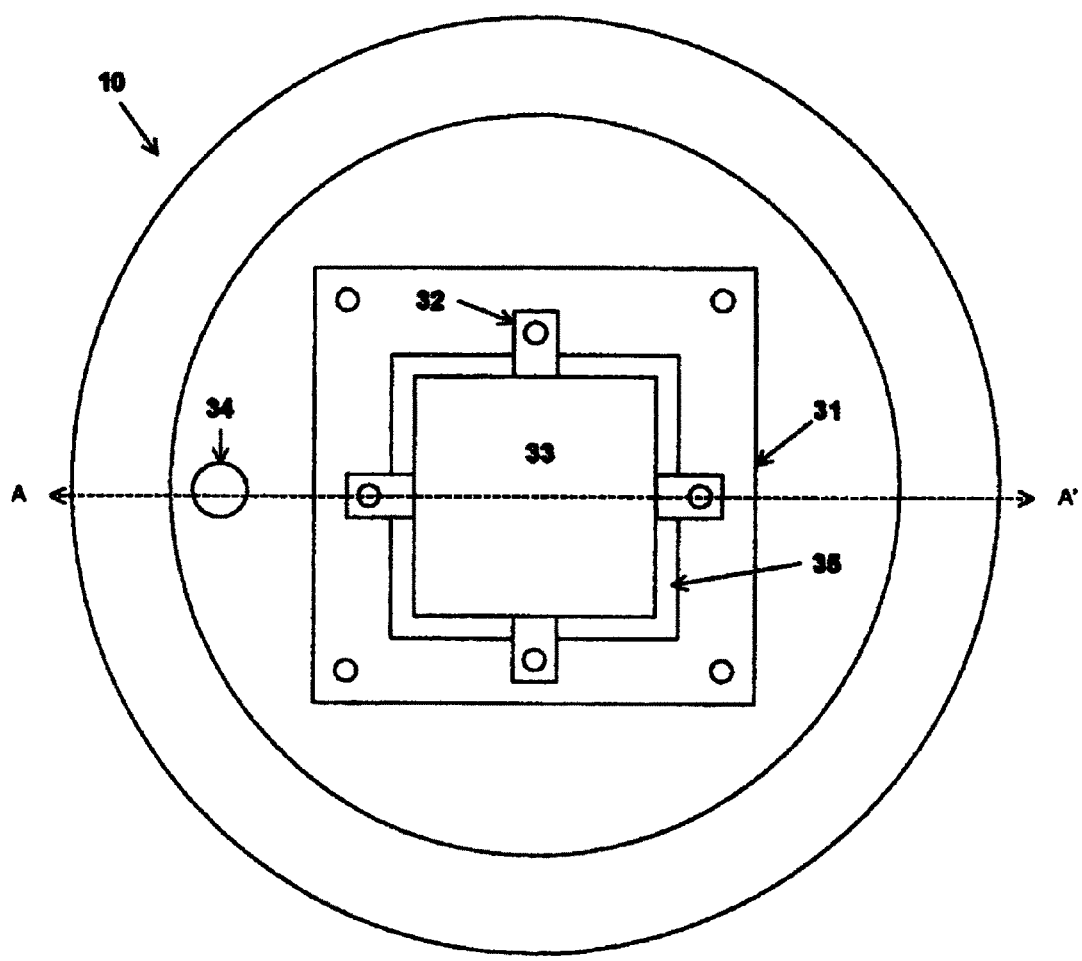
FIG. 3 illustrates schematically a plan view of a substrate holder and CBD chamber in accordance with one aspect of the present invention.
Figure 4:
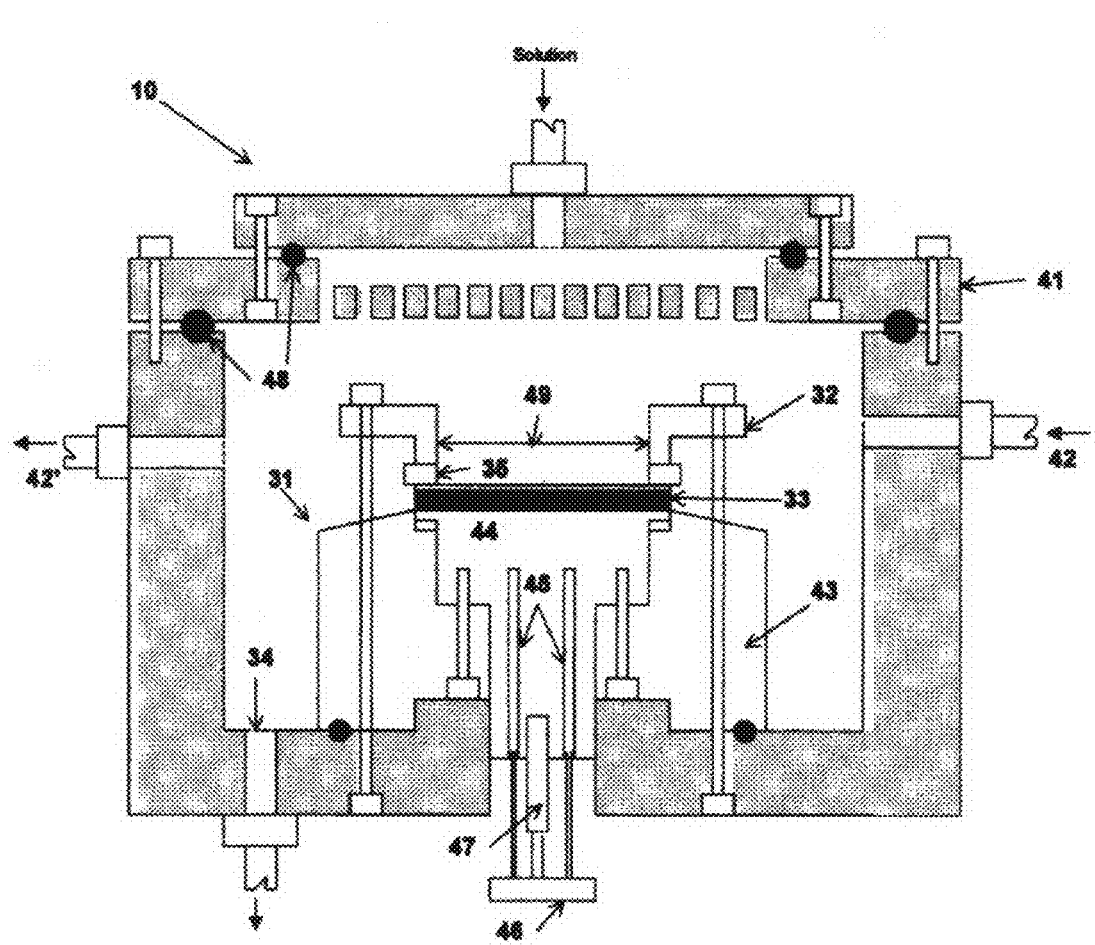
FIG. 4 illustrates schematically a vertical section along A-A' of the substrate holder and CBD chamber illustrated in FIG. 3 in accordance with one aspect of the present invention.

The reaction chamber 10 illustrated schematically in FIGS. 3-4 includes a substrate holder assembly 31 with clamps 32 arranged to secure substrate 33 under spacer 35, a delivery system that includes a showerhead 41 for supplying and distributing processing solution within the chamber and over a substrate (workpiece) 33. The substrate holder assembly 31 comprises an insulative housing 43 with a heater block 44 formed therein. The combination of the heater block and an upper insulative surface (over which a substrate is placed) is referred to herein as a platen. Various of these components are illustrated as having circular or rectangular shapes, but the functionality of the reaction chamber is not limited to these example geometries. A continuous spacer 35 may be positioned about the upper, exposed surface of the workpiece, e.g., along the periphery thereof or beyond the periphery. In other embodiments the continuous spacer may be replaced by a spacer including apertures or slots or may be replaced by several individual spaced-apart spacers wherein the separation facilitates exit flow of processing solution from the reaction region adjacent to the exposed upper substrate surface through the solution return subsystem to the chilled reservoir 11. The chamber may further include a pressure gauge, a gas inlet 42, a gas outlet 42', and a drain line 34 which is part of the return subsystem that directs partially spent processing solution from the chamber 10 to the reservoir 11. In this example, to minimize maintenance and extend useful life of the chamber, all chamber parts that are exposed to the chemical solution are preferably made of chemically inert material, such as polytetrafluoroethylene (PTFE) or perfluoroalkoxy (PFA), or the surfaces of such parts may be coated with a PTFE or PFA film. For example, the spacer 35 (positioned about the substrate to create a shallow catch region or substrate opening 49 for retaining flowing portions of the processing solution over the substrate surface) may be formed of a relatively rigid material such as PTFE, PFA or PFA-coated or PTFE-coated metal. The illustrated continuous spacer 35 encloses an area of the substrate surface that may be continuously, continually or periodically replenished with processing solution, as solution previously supplied from an overlying showerhead overflows or pours outward from the volume enclosed by the spacer 35 and passes into the drain line 34.

It will be appreciated that the operation of spacer 35 differs fundamentally from the "containment frame" of McCandless et al. '845 in that McCandless contemplates a substantially static containment of a fixed volume of solution, whereas the present invention relies on continuous or periodic replenishment using chilled solution from the showerhead. Applicant uses this novel feature to further cool adjacent hardware components as well as cool the solution in areas other than the immediate deposition layer in order to more effectively suppress homogeneous nucleation.

To prevent leakage of various process liquids or gases, seals or O-rings 48 may be placed at various locations where two components face one another, as is well known in the art.

Other flow means are contemplated, including provision of flow lines about the spacer(s) to actively or passively remove partially spent chemical solution from regions overlying the substrate. For reactions performed under atmospheric conditions, processing solution overflowing from the spacer volume above the substrate is collected at the bottom of the chamber and continuously drained. The processing chamber may be filled or continuously purged with filtered air or nitrogen for controlling air-born particles during deposition. To effect this, a gas supply valve may be positioned in the gas supply line 42 to control injection of the air or inert gas into the chamber while an exhaust valve is positioned in the gas exhaust line 42'.

A feature of the FIG. 1 embodiment is that the rate of film formation, e.g., the rate of growing II-VI semiconductor materials, in the FGS is relatively high while the ratio of the volume of processing solution about the film formation surface on the substrate to the area of the film formation surface over which the film is formed is small, i.e., small relative to the corresponding ratio present in a conventional, traditional chemical bath. The foregoing statement is made with the understanding that the geometry and orientation of the substrate within a traditional chemical bath is typically different than that of the FGS since the traditional bath typically immerses the substrate in a heated vessel containing processing solution while the FGS positions and heats the substrate to receive a supply of processing solution, e.g., via a continuous or continual or periodic flow such as from above. Thus a direct comparison of such ratios is not easily ascertained. Nonetheless, according to the invention, the applicable volume-to-surface area ratio is effectively substantially smaller than that which would be present in a traditional bath, e.g., when the substrate is positioned in a horizontal or vertical orientation inside a vessel filled with processing solution or otherwise oriented with respect to a level solution surface. For operation in the FGS, the ratio of the volume of processing solution about the film formation surface of the substrate to the area of the substrate surface over which the film is formed is referred to herein as the Volume-to-Surface Area Ratio (VSAR). When the VSAR is high, a relatively small fraction of the processing solution is effectively contributing to the film formation while the remaining portion may result in formation of colloids in the bulk of the solution. In the FGS the spacer allows a limited volume of processing solution to be positioned above the substrate surface. The spacer may appear like a shallow tank, but actually serves as a temporary, periodically replenished collection region, as portions of the processing solution remain over the substrate surface for brief periods in order to effect chemical reactions along the exposed surface. The exemplary continuous spacer is secured along the periphery of the substrate with a multi-clamp design (shown in FIGS. 3 and 4) which allows the solution to flow over the spacer. Thus, the volume of chemical processing solution retained within the spacer confines is generally determined by the height of the spacer above the substrate, ranging, for example, between 0.1 and 10 mm. Depending on the specific process, setting of process parameters (e.g., substrate temperature, flow rate of processing solution, concentration of reactants in the solution) a spacer with a suitable or optimum height may be chosen. Due to the complexity of multiple variables, and the desire to maximize the rate of film formation, it may be necessary to experimentally determine process geometries and settings. The FGS may be programmed to deliver a continuous or periodic flow of processing solution through the shower head, or may be programmed to deliver metered volumes, to provide a uniform delivery of the solution over the film formation surface. With a continuous spacer formed over a uniformly heated substrate and a continual or periodic replenishment of processing solution over the reaction region of the substrate, a low VSAR effects a relatively uniform film growth over the entire region of film growth at a relatively high growth rate suitable for volume manufacture. Among the several embodiments disclosed herein, exemplary VSARs range from 0.1 to 10 mm, with exemplary corresponding film growth rates ranging from 100 to 1000 Å/minute and film thicknesses of satisfactory uniformities (e.g., less than 10 percent) may exceed several microns.

Another feature of the invention is that during the film formation process the film growth surface may be kept at a relatively high temperature while other surfaces within the reaction chamber are relatively cool. This feature can minimize or prevent formation of film on surfaces other than that of the substrate. By way of example, the temperature differential between the growth surface and other surfaces in the reaction chamber can range from 60° C. or 70° C. to 200° C. and may, for example be 140° C. The chamber pressure, the solution flow rate, and the substrate temperature may be adjusted to achieve deposition rates on the order of 500 Å/min to produce a relatively uniform film having a thickness on the order of one to five microns. The achievable uniformity (i.e., measurable based on variation in film thickness) over a film growth area of 21 $cm^2$ is generally less than 10% and in some instances less than 5%. As shown generally in FIG. 1, during operation of the FGS the processing solution passes from within the volume defined by the spacer 35 to the solution return line and the associated reservoir 13 in order to be pumped back into the solution reservoir 11 for chilling and recirculation until such time that the requisite chemicals are so spent that the solution should be replaced. In the process of passing into the return line, the processing solution leaving the volume defined by the spacer may join other portions of processing solution which are relatively cool. That is, such other portions of processing solution are injected through the showerhead and into regions of the chamber outside the region of the heated film growth surface such that these portions are relatively cool. The latter, relatively cool solution may mix with portions of the solution flowing from the spacer volume to facilitate temperature reduction of the heated solution, thereby limiting formation of undesirable products in the reaction chamber. The solution reservoir may include a temperature sensor 16, a chemical analyzer 18, a pH meter 17, and a pair of liquid level switches 14,15. The temperature of the solution reservoir is controlled by the chiller and the reservoir is typically maintained at a temperature in the range of 10-25° C. A chemical analyzer 18 is connected to the solution reservoir to monitor the chemical composition of the reservoir constantly or periodically. When needed, the premixed processing solution is added to the solution reservoir from a tank containing pre-mixed solution of desired concentration, although the solution may be stored in a more concentrated form and diluted upon or prior to entry into the reservoir. For example, the system controller may operate valves associated with the liquid control panel to dispense distilled (DI) water and precursor solutions directly into the reservoir for mixing in the solution reservoir. In some chemical processes, deposition rates are significantly influenced by the pH of the solution. The pH meter 17 monitors the pH of the solution bath and the pH may be adjusted under direction of the controller. Liquid level in the reservoir is controllable with first and second liquid level sensor switches. The first liquid level sensor switch 15 provides a signal to the controller when a minimum desired level of solution resides in the reservoir. The second liquid level sensor switch 14 provides a signal to the controller 20 when a maximum level of liquid resides in the reservoir.

The entire system may operate under direction of the system controller, which actuates numerous valves and switches in response to sensor information, e.g., signals provided by level switches. The system controller controls delivery of processing solution to the reaction chamber via the solution flowmeter and may also selectively rotate the showerhead during the chemical process. A thermocouple is provided to control the platen temperature during operation. The controller also controls delivery of pre-mixed processing solution to the solution reservoir to maintain suitable level of processing solution in the reservoir.

For periodic maintenance of the processing chamber, a chemical solution for chamber cleaning may be supplied from a cleaning chemical tank via a cleaning chemical supply line. DI water for rinsing the chamber after chamber cleaning may be supplied from a DI water tank via a DI water supply line. Delivery of cleaning chemical is controlled by a cleaning chemical supply line valve. Delivery of DI water is controlled by a DI water supply line valve. A separate drain under control of a dedicated valve may be provided to collect the chamber cleaning chemical and rinse water. Generally, the flow of drain liquid from the chamber is controlled by a combination of the solution return line valve and a cleaning chemical return line valve under direction of the controller. The collected cleaning chemical may be sent to a chemical recovery processing unit for recovery of chemical ingredients.

In the subject chemical film growth processes, the formation rates may be increased as a function of pressure. It will be appreciated that chamber 10 may be maintained at elevated pressure using filtered air or nitrogen injected into the chamber via the gas inlet 42. Chamber pressure may continuously monitored by the pressure gauge 19.

FIG. 3 provides a simplified plan view of the chambers shown in FIG. 1. The exemplary chamber 10 comprises a circular housing and a square substrate holder 31 for processing a square substrate 33. In other embodiments, the chamber may comprise a circular substrate holder and a circular chamber housing for processing a circular substrate. In still other embodiments, a chamber may comprise a square substrate holder in a square chamber housing. The illustrated substrate holder assembly includes a clamping unit having a plurality of clamps 32 coupled to a continuous spacer 35. The exemplary clamping structure shown in FIG. 3 includes four clamps. Each clamp is connected to the chamber bottom or base region by a substrate holder screw (shown in FIG. 4). In an automated system, the clamping unit may be operated by one or more actuator mechanisms for automatic clamping of the spacer onto the substrate and releasing of the spacer from the substrate. The actuators may be of any familiar type such as hydraulic, pneumatic, or electromechanical devices. The substrate holder assembly further includes a plurality of substrate holder screws which are connected to the chamber bottom wall (shown in FIG. 4) for securing the substrate holder assembly. A drain 34 is provided at the chamber base for recirculation of processing solution to the solution reservoir and disposal of cleaning chemical and rinse water during periodic chamber cleaning.

FIG. 4 depicts a cross-sectional view of the FGS reaction chamber taken along line A-A' of FIG. 3. The chamber includes a lower chamber wall having a top surface, a showerhead plate 41 having an upper surface and a lower surface, a chamber lid having an upper surface and a lower surface configured for placement against the top surface of the lower chamber wall to effect a sealing arrangement during operation of the chamber, and a substrate holder assembly for holding a substrate during deposition. The showerhead plate 41, having a plurality of openings in a central region thereof is positioned along a lower surface of the chamber lid so that it is positioned at a level coincident with the top surface of the lower chamber wall during chamber operations. The showerhead may be secured by a showerhead clamping unit comprising showerhead plate nuts and shower head plate screws or may be secured with a quick release clamping mechanism for an automated operation. A showerhead O-ring may be placed between the lower surface of the showerhead and the top surface of the lower chamber wall to facilitate creation of an air-tight seal when the chamber is closed with the lid. The chamber lid is placed over the showerhead plate and secured by a chamber lid clamping unit comprising an upper chamber lid nut, a lower chamber lid nut and a chamber lid screw. The lower chamber wall includes a gas inlet 42, a gas outlet 42', and a processing solution drain 34.

Depending on the specific process, the substrate can be heated to some desired temperature during the deposition process. A feature of the invention is that the film growth rate in the FGS is exponentially dependent upon temperature, and it is therefore beneficial to keep only the substrate at a high temperature while chamber surfaces are kept at a low temperature for efficient, selective deposition. In the example embodiments the platen 44 is a PTFE or PFA coated thermally conductive block (e.g., formed of copper or aluminum) and is positioned along or near an upper surface of the insulating substrate holder housing 43 to provide uniform heating of the substrate while other portions of the housing are maintained at low temperatures. The substrate holder housing 43 may be made of PTFE or ceramic coated with PTFE or PFA or may be an actively cooled metal that is coated with, for example, PTFE or PFA. Such an active cooling arrangement can assure that surfaces of the substrate holder housing are kept at a relatively low temperature to prevent film formation thereover. At the same time, for example, the substrate may be heated by one or more heating elements 45 embedded in the thermally conductive platen 44. The thermally conductive platen 44 can be resistively heated by applying an electric current from an AC power supply 46 to the heating elements 45. The substrate 33 is, in turn, heated by the platen. The conductive platen may be made of CVD-SiC or made of high conductivity metal like Cu or W—Cu alloy or Al coated with PFA or PTFE to protect the platen from chemical reaction with process solution. Although not illustrated, the heating elements used to control the temperature of the film formation surface may alternatively be formed in a horizontal orientation and may be in an array of parallel elements or a two dimensional matrix or mesh-like design to facilitate uniform generation and distribution of thermal energy and achieve relatively uniform temperature across the film-forming surface. Radiant heat generation is also contemplated, e.g., based on positioning of radiant sources above or adjacent the film forming surface. For the illustrated embodiments, a temperature sensor 47, such as a thermocouple, is also embedded in or near the platen to monitor the temperature of the platen or substrate in a conventional manner. The measured temperature is used in a feedback loop to control the power supplied to the heating element 45, whereby the substrate temperature can be maintained or controlled at a desired temperature suitable for the particular process application.

The showerhead 41 which introduces a processing solution over the substrate surface 33 is located above the substrate holder assembly 31. The showerhead 41 receives processing solution and other liquids based on the configuration of the liquid control panel, which directs the supply of various liquids used in different steps of the process sequence or used in different steps of the chamber cleaning sequence. The showerhead allows processing solutions from the liquid control panel to be uniformly introduced and distributed over the substrate holder assembly. In the illustrated examples, the showerhead dimension is sufficiently larger than the heated platen and the substrate to provide a flow of cool processing solution along regions about the substrate holder housing adjacent the platen. Optionally a cooling channel may be formed inside the substrate holder housing to further limit temperature elevation beyond the film forming surface of the substrate. In FIG. 4, an exemplary mechanical clamping unit comprising an upper clamp nut, a lower clamp nut, and a clamp screw is also illustrated. The mechanical clamp unit mechanically presses the spacer against the substrate. In an automated system, the mechanical clamping unit may be operated by one or more mechanical actuators.

FIG. 4 shows an embodiment in which the showerhead 41 is substantially fixed in position relative to the substrate holder assembly 31. It will be appreciated that in other contemplated embodiments, it might be desirable to use a moving, rotating, or oscillating showerhead as another means of ensuring uniform flow of process liquid over the entire substrate surface. Skilled artisans can easily add such modifications without undue experimentation using electric motors, mechanical linkages and the like as are well known in the art.

Figure 5:
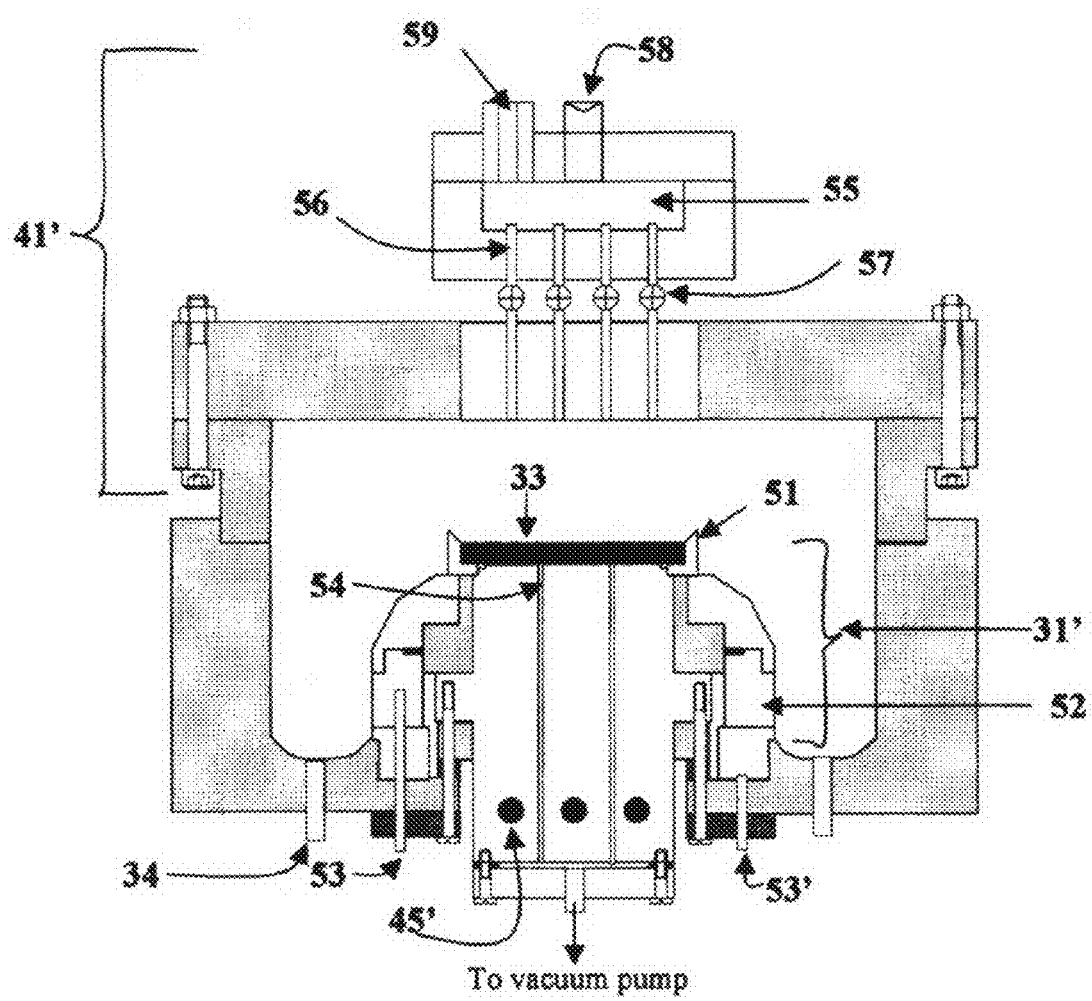
FIG. 5 illustrates schematically a vertical section of the substrate holder and CBD chamber in accordance with another aspect of the present invention.

Embodiments of the reaction chamber 10 have been illustrated with exemplary fasteners for attaching components to one another and for attaching the workpiece within the reaction chamber for processing. It will be appreciated that a vacuum chuck may also be used to secure the substrate 33 to platen 44. Other designs are contemplated. The cross sectional view of FIG. 5 illustrates another exemplary embodiment of an FGS process chamber. In this embodiment, the substrate holder 31' incorporates a vacuum chuck including vacuum orifices 54 to secure substrate 33. A ring 51 serves the function of spacer 35 (i.e., defining a volume of entrapped process liquid above the substrate. Substrate holder 31' further incorporates a cooling jacket 52 maintained by the flow of coolant through inlet 53 and outlet 53'. The showerhead assembly 41' further incorporates a temporary solution reservoir 55, from which process fluid is dispensed through capillary tubes 56 and microswitch valves 57. Solution is added to temporary reservoir 55 through inlet 58. An outlet 59 provides pressure relief so that the pressure within reservoir 55 is held constant.

It will be appreciated that the pattern of openings in the showerhead may be relatively uniform across the face or it may be nonuniform. For instance, the showerhead may include two concentric zones: an inner zone centered over the spacer seal for dispensing processing solution on to the film growth surface of a substrate; and an outer zone for dispensing additional processing solution to cool portions of the processing chamber outside the spacer opening which receives the substrate. The inner showerhead zone primarily directs processing solution to the film growth surface to effect chemical reactions which lead to film growth. Relatively hot, partially spent solution exits the spacer volume as new cool solution is dispensed therein. The outer showerhead zone primarily directs cool solution to regions of the chamber beyond or outside the spacer opening. This flow of relatively cool solution serves to cool sides of the platen and portions of the substrate holder assembly which may be heated incidental to the heating of the substrate. The same flow can mix with the relatively hot, partially spent solution that exits the spacer volume. The combined flow exits the chamber 10 via drain 34 may return to solution reservoir 11 such as shown in FIG. 1. The returning solution may be pre-cooled prior to entry into the reservoir 11.

It will be understood that flows through the inner and outer zones of the showerhead may be under separate control to optimize process parameters and quality of film growth. The inner zone of the showerhead may receive chemical processing solution from a first inlet. The system controller 20 directs the volume or volumetric flow rate and frequency (if not a continuous flow) for dispensing of solution into the spacer opening through the inner showerhead zone based on, for example, specific chamber geometries, a selected VSAR, the film forming chemistry and the reaction rate—all to achieve a satisfactory quality of film formation. Flow through the inner zone is controlled and dispenses the solution over the spacer seal to react along the film growth surface of a substrate. The outer zone of the showerhead may receive chemical processing solution from a second inlet. The system controller directs the volume or volumetric flow rate and frequency (if not a continuous flow) for dispensing of solution through the outer showerhead zone and into regions of the chamber primarily outside the spacer opening based on, for example, specific chamber geometries, heat transfer characteristics of the components being cooled, temperature stability of the partially spent processing solution. Parameters may be optimized to minimize formation of undesirable precipitates in solution being cycled back to the reservoir and to minimize or eliminate formation of film on, for example, walls or other surfaces in the reaction chamber.

In one example of process conditions when the chamber is operated with the dual zone shower head, the inner zone may be connected to a metering pump which dispenses solution over the substrate opening every 20 seconds in a volume which is one to two times the spacer volume. The volume dispensed may be a multiple of the spacer volume to quickly quench the partially spent solution and assure complete replenishment of processing solution in the spacer volume. At the same time, the outer zone may be programmed to dispense, with the assistance of a pump, a continuous flow of 30 to 100 ml/min (for a chamber designed for coating a 5×5 cm substrate) in regions outside of the spacer opening to cool the sub-chamber surfaces and the solution which flows over the spacer.

Other arrangements which provide further optimization of process conditions include provision of processing fluid from the second inlet at a lower temperature than processing fluid delivered from the first inlet so that the outer zone of the showerhead provides solution with greater cooling capacity while the inner zone provides solution which requires less heating in order to effect desired reactions along the film growth surface. That is, the solution can be cooled to a temperature which assures sufficient stability while being transferred and dispensed but which minimizes the amount of heat generated to sustain the growth surface at a minimum desired temperature. For example, the temperature of solution exiting the inner zone of the shower head may be in the range of 20-25° C. while the temperature of solution exiting the outer shower head may be in the range of 10 to 15° C. or lower. Optionally a cooling channel may be formed inside the substrate holder housing to further limit temperature elevation beyond the film forming surface of the substrate. Thus it can be seen that the inventive apparatus and method provides the user with wide latitude to adjust the operating conditions for particular purposes.

Figure 6:
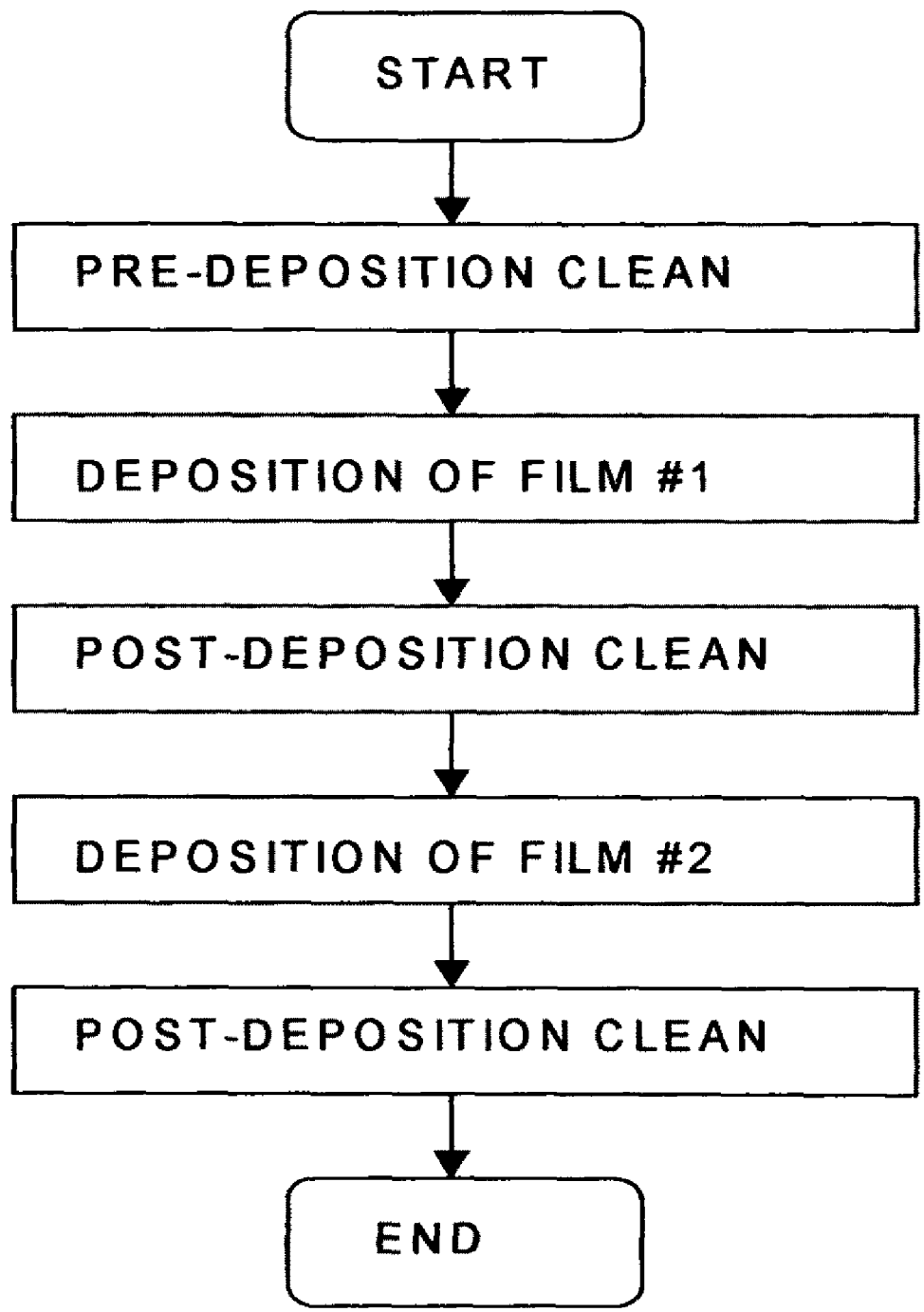
FIG. 6 presents a process flow diagram for a two-layer film stack prepared according to one aspect of the invention.

In some applications, more than one layer of semiconductor material may be formed on a substrate by a sequence of chemical processes. Referring to FIG. 6, there is shown a flow chart of exemplary steps that sequentially place multiple layers of material on the substrate. Formation of two layers in a sequence may include a clean step for removing contaminants from the substrate surface, followed by formation of a first layer. Next, a first post-film formation clean step is performed for removing residual chemicals from the substrate surface, followed by a step for forming a second film layer different from the first layer. This is followed by a second post-film formation clean step for removing residual chemicals from the substrate surface. In the pre-film formation clean step, a substrate placed on the substrate holder assembly inside the chamber is cleaned with a first cleaning solution, rinsed with de-ionized (DI) water, and dried, for example, by a spin drying method as is common in semiconductor device manufacturing. Next, a first semiconductor layer is formed along the surface of the substrate, followed by a postfilm formation clean wherein the substrate is cleaned with a second cleaning solution, rinsed with DI water for a suitable duration and dried. For multi-layer film formations, a system comprising a plurality of process chambers and a substrate handling robot can offer high operation efficiency and throughput resulting in a relatively low equipment cost per film layer. A single robot may provide substrate handling for multiple processing chambers.

Figure 7:
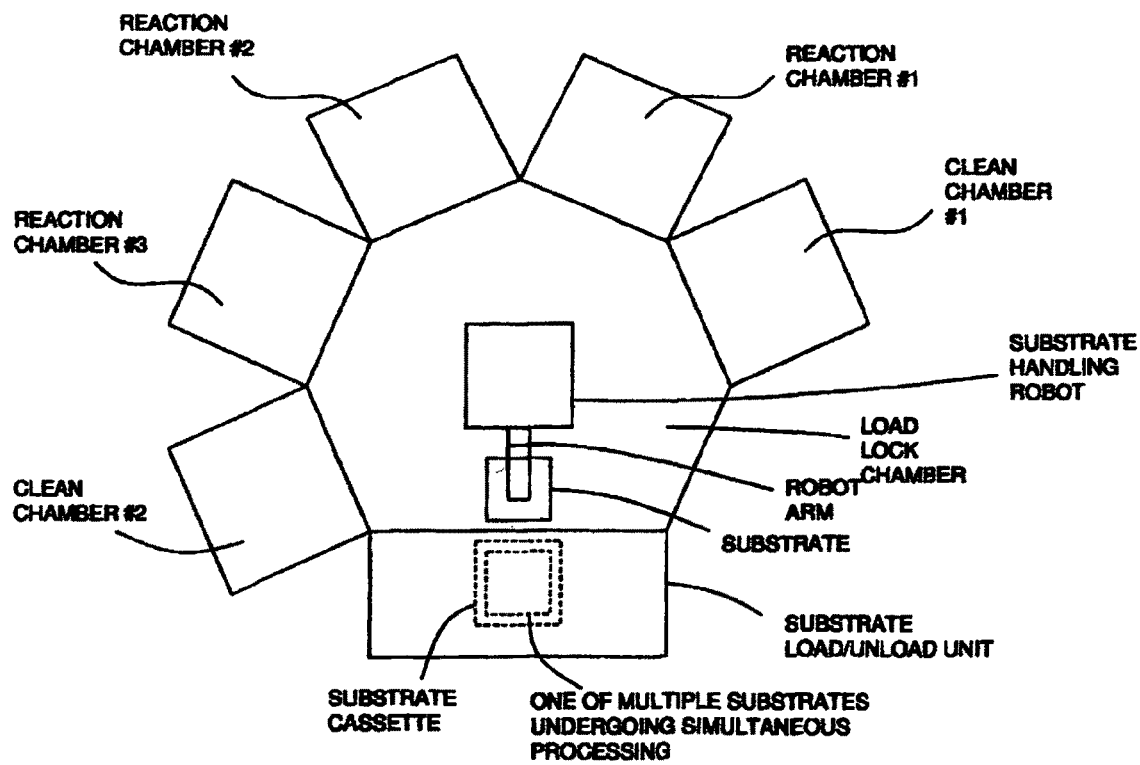
FIG. 7 illustrates schematically a number of deposition chambers in accordance with the present invention arranged in a cluster tool configuration.

FIG. 7 depicts an exemplary multi-chamber system incorporating one or more of the chambers illustrated in the foregoing figures and comprising a substrate load/unload unit, an optional loadlock chamber, a plurality of processing chambers, and a substrate handling robot. Each processing chamber may be dedicated to either a reaction or a clean. In the exemplary system of FIG. 7, the processing chambers include a first clean chamber, a first reaction chamber, a second reaction chamber, a third reaction chamber, and a second clean chamber. In operation of the multi-chamber system of FIG. 7, a substrate cassette loaded with one or more substrates is placed in the substrate load/unload unit. The substrate handling robot removes a substrate from the load/unload unit and places it in a selected process chamber under direction of a system controller (not shown). After deposition is complete, the robot picks up the substrate from the processing chamber and transfers the substrate to another chamber or to the substrate cassette in the substrate load/unload unit. In other embodiments, the substrate load/unload unit may handle a plurality of substrate cassettes for higher operational efficiency or may simultaneously process wafers in different chambers. To provide high pressure chemical film growth conditions in the system of FIG. 7, the loadlock chamber may be configured to include or movably receive the substrate storage cassette. With such an arrangement, higher system operating efficiencies can result as the frequency of pressure equalization for substrate transfer between the substrate load/unload unit and the individual chambers is reduced. In other embodiments, some chambers or all chambers may be equipped to perform both chemical processing and cleaning.

Figure 8:
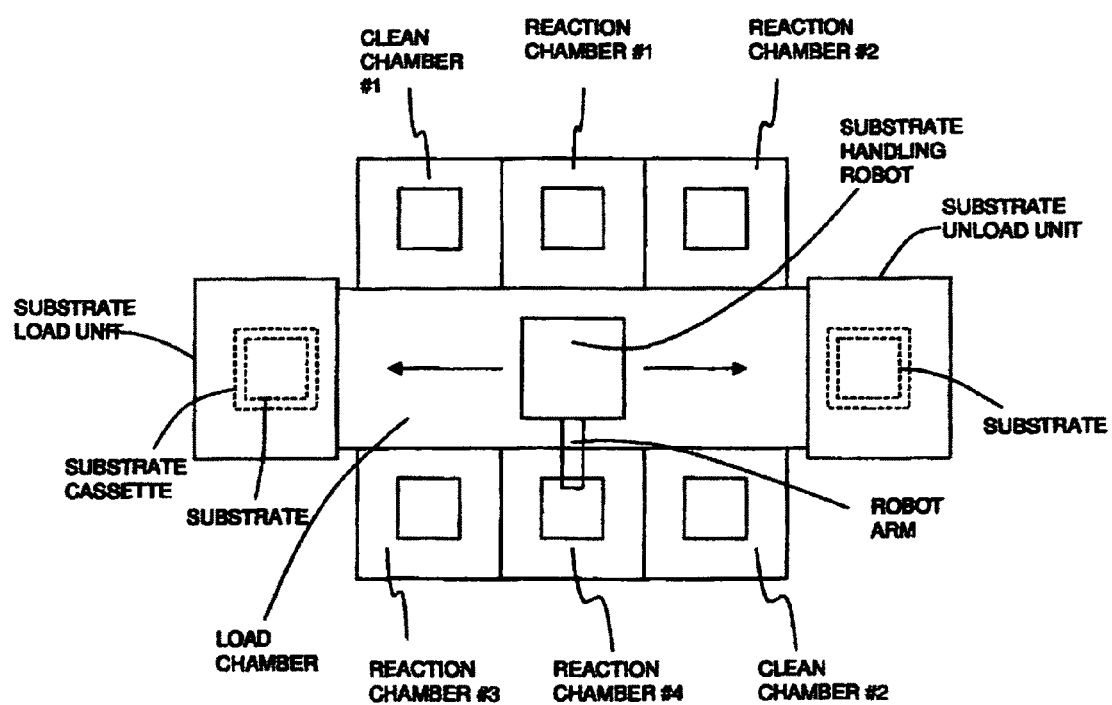
FIG. 8 illustrates schematically another way in which multiple processing chambers may be arranged.

FIG. 8 depicts another exemplary multi-chamber FGS according to the invention. The multi-chamber system comprises a substrate load unit, a load chamber, a substrate unload unit, a plurality of processing chambers, and a substrate handling robot positioned to move substrates between units and one or more chambers. The processing chambers include a first clean chamber, a first reaction chamber, a second reaction chamber, a third reaction chamber, a fourth reaction chamber, and a second clean chamber, each chamber being dedicated to either chemical film growth or a cleaning operation. A substrate cassette loaded with one or more substrates is placed in the substrate loader. The substrate handling robot in the load chamber picks up a substrate and places in a selected process chamber by a system controller (not shown). After deposition is complete, the robot picks up the substrate from the processing chamber and transfers the substrate to the substrate cassette in the substrate unload unit. In other embodiments, the substrate load unit and unload unit may handle a plurality of substrate cassettes for higher operational efficiency.

It will be appreciated that in some instances it is desirable to deposit a film onto a somewhat continuous, flexible substrate 33' in a roll-to-roll configuration. The inventive apparatus may be modified as shown schematically in FIG. 9 by modifying the spacer assembly 35' to form a thin framework that can be lowered against a selected portion of the substrate 33' to secure the substrate against the heater block 44 and define the volume of solution held over the area of deposition 49. Any conventional means may be used to provide a fluid seal when the spacer assembly 35' contacts the film, such as gaskets, O-rings or various compliant materials. The substrate may be handled by any conventional roll-to-roll handler, which may preferably include tensioning rolls and drive mechanisms on either the feed roll or the take-up reel, or both. Vacuum delivered via one or more orifices 54 may be used to hold substrate 33' flat against heater block 44. Insulation 61 may be placed between heater block 44 and cooling jacket 52.

Figure 9:
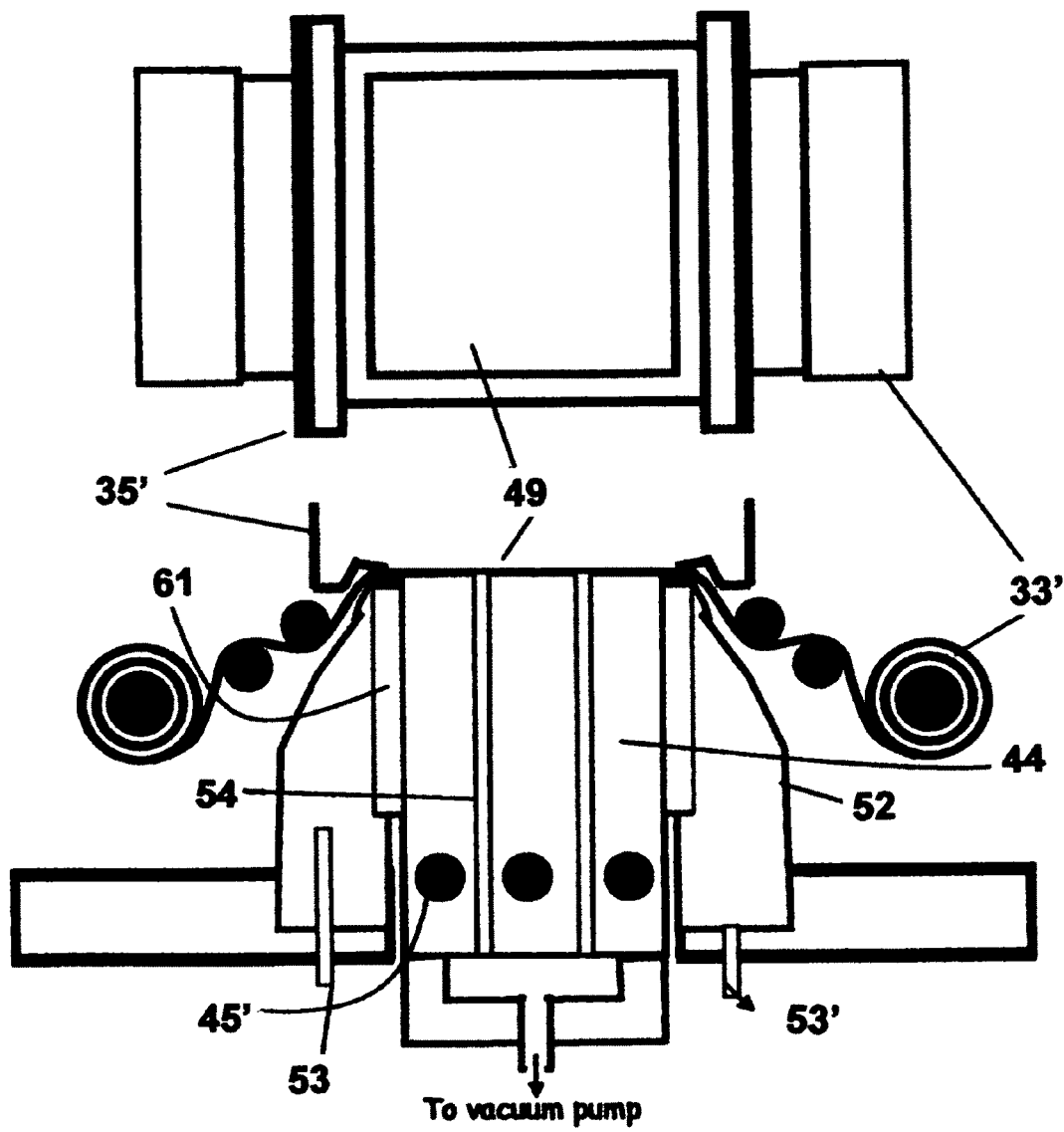
FIG. 9 illustrates schematically a plan view (upper) and cross-sectional view (lower) of an embodiment of the invention adapted for deposition onto a continuous flexible substrate.

The operation of the system illustrated in FIG. 9 is similar to that of other embodiments, with the following differences: First, the flexible substrate 33' is fed from the feed roll and secured to the take-up roll. Second, the spacer assembly 35' is lowered against the substrate, securing substrate 33' against the heater block and defining the area upon which film deposition will occur. Deposition is carried out in the same manner as in the previously-described embodiments. When a film of adequate thickness has been deposited, spacer assembly 35' is raised and the substrate is indexed forward to being a new area under the spacer assembly for the next deposition.

It will be appreciated that downstream operations such as washing, drying, heat treatment, dicing, etc., may be carried out in any desired order and may be done while the substrate is still continuous or may be done after individual "panes" have been diced from the roll. Heat treatment, in particular, may be carried out by passing the continuous film through an oven, microwave cavity, or radiant heater zone, with the final take-up roll located at the opposite end of the heating apparatus. Conventional means may be employed to buffer the movement of the film between the deposition stage and the heat treatment stage if desired. Rinsing and drying may be carried out in the buffer zone, if desired, so that the film may enter and move through the heat treatment stage in a uniform manner without excess moisture.

The exemplary film growth systems described in FIGS. 1-8 may be used to form films comprising any of a wide range of materials, including metals, semiconductors, and insulators on a temperature-controlled substrate from constituents in a solution by series of reactions which are performed while controlling one or more of: the substrate temperature, the chamber pressure, the flow rate of the processing solution, the pH and the composition of the solution. The following description of a chemical process suitable for use in one of the aforedescribed chambers will lead to formation of an intrinsic II-VI compound semiconductor film. In this example, a set of chemical reactions provide relatively uniform and low defect formation of a stoichiometric II-VI compound film, e.g., CdS. This is to be compared with the film quality achievable via physical vapor deposition that may involve sputtering of the Group II and VI species. Generally, a mix of one or several ligands is combined in an aqueous solution containing a group II salt having an anion that can act as a supplementary and somewhat competitive complexing agent of the group II element cation of the salt to form a complex of low or moderate stability. The solution further includes an OH⁻ source for pH control, and a source of a group VI element, all mixed together in the right proportion in an aqueous bath to grow an intrinsic II-VI compound film on a substrate. The substrate forms the base of the replenishable shallow solution bath. The substrate is preferably hydrophyllic, thereby facilitating accumulation of OH-bonds along a surface thereof. If the OH⁻ is derived from NH₄OH, then an ammonium salt buffer, NH₄Cl, with the same anion as that of the group II salt, CdCl₂, is also included in the solution to avoid depleting OH⁻ and NH₃. When this solution is maintained at 5 to 15° C. there will be substantially no reaction between the OH⁻ radicals and the complexes for more than two weeks (very good shelf life). When the deposition is performed in the chamber on a 5 cm×5 cm substrate (nominal), the aqueous solution may be formed in the following proportions:

| | |
|---|---|
| CdCl2 | 0.0015M |
| Ammonium chloride (NH₄Cl) | 0.006M |
| Ammonium hydroxide (NH₄OH) | 0.77M |
| Potassium nitrilotriacetate (NTA or N(CH₂OOK)₃) | 0.0009M |
| Thiourea ((CS(NH₂)₂) | 0.003M |

Ligands: Cl—, NH₃ (from NH₄OH), NTA (N(CH₂OOK)₃)

Group II salt: CdCl₂

Group VI element source: Thiourea CS(NH₂)₂

OH— source: NH₄OH

NH₃ buffer: NH₄Cl

The constituents dissociate as follows:

1) $NH_4Cl \rightarrow NH_4 + Cl^-$

2) $NH_4OH \rightarrow NH_4 + OH$ wherein $NH_4^+ + OH^- \rightarrow NH_3 + H_2O$ 3) $KOH \rightarrow K^+ + OH^-$ 4) $CdCl_2 \rightarrow Cd^{2+} + 2Cl^-$ The NH₄Cl and NH₄OH regulate the OH⁻ concentration in the solution. With sufficient OH⁻ concentration in the solution, there will be a significant number of bonds between the OH⁻ radicals and sites along the hydrophilic substrate so as to facilitate reaction of complexes containing the Group II element, e.g., Cd, to form an intermediary Cd-hydroxyl compound bound to the substrate with the help of heat.

With dissociation of CdCl₂ per (4), above, in the presence of the NH₃ ligand, cadmium ions form first Group II based complexes (I) according to:

$$Cd^{2+} + nNH_3 \Leftrightarrow [Cd(NH_3)_n]^{2+} \quad (I)$$

where n=1, 2, 3, or 4. The stability of this complex depends on the value of n. The higher the value of n, the more stable the complex becomes. The potassium nitrilotriacetate, N(CH₂OOK)₃, or NTA also acts as a ligand forming second Group II based complexes (II) according to:

$$Cd^{2+} + nN(CH_2OOK)_3 \Leftrightarrow [Cd(N(CH_2OOK)_3)_n]^{2+} \quad (II)$$

The Cl⁻ supplied by CdCl₂ and NH₄Cl acts as a third ligand to form a third Group II based complex according to:

$$Cd^{2+} + nCl^- \Leftrightarrow [Cd(Cl)_n]^{2+} + (ne^-) \quad (III)$$

The use of multiple ligands can optimize binding of Cd²⁺ or other metallic ions of interest into complexes which stay in solution and permit better control of the growth of high quality intrinsic films, allowing for on-demand delivery of the metallic ion at the reaction site:

$$OH^-[substrate] + [Cd(L)_n]^m \rightarrow^{heat} Cd(OH)^+[substrate] + nL^p$$

wherein L represents any of one or more suitable ligands, e.g., NH₃, N(CH₂OOK)₃, or Cl⁻. and $[Cd(L)_n]^m$ represents one of the corresponding complexes containing Cd²⁺.

Furthermore, to complete the formation of CdS principally at the substrate surface, the thiourea ((NH₂)CS) in the presence of a sufficient OH⁻ concentration first undergoes a partial reaction as shown below to produce HS⁻:

$$(NH2)CS + OH - \Leftrightarrow SH^- + H_2O + H_2CN_2$$

With the metastable Cd(OH)⁺ already bound to the substrate and with HS present in surrounding solution, it becomes possible to convert all of the Cd(OH)⁺ to CdS on the heated substrate:

$$Cd(OH)^+[substrate] + SH^- \rightarrow^{heat} CdS[substrate] + H_2O.$$

Since the Cd²⁺ ions are optimally and primarily bound in a hydroxyl metastable compound at the desired site of deposition, the spontaneous formation of Cd(OH)₂ that will eventually lead to the precipitation of CdS in the solution tank is inhibited. To further ensure prevention of precipitate which would then deposit out of the solution, the solution reservoir containing the aqueous solution which flows into the chamber is maintained at low temperature, e.g. 5 to 15° C. That is, generally there is inhibition of the reaction $$Cd^{2+} + OH^- \rightarrow Cd(OH)_2$$

which would typically be present in a chemical bath deposition technique that attempts to deposit poor quality CdS directly from the aqueous solution on to a substrate, e.g., $$Cd^{2+} + S^{2-} \rightarrow CdS.$$

Instead of depositing CdS as a precipitate in a bath and on a substrate simultaneously, it is possible to create the CdS on a hydrophilic substrate surface only. Further, as a substrate surface becomes completely covered with CdS, the reaction continues as hydroxyl ions present in the aqueous solution associate with the newly deposited CdS to continue formation of the $Cd(OH)^+$ bound to the exposed CdS. With $HS^-$ present in surrounding solution, it becomes possible to convert all of the $Cd(OH)^+$ to CdS:

$$Cd(OH)+[CdS]+SH^- \xrightarrow{heat} CdS[CdS]+H_2O.$$

Generally, there is little or no precipitation or true deposition of the CdS on the substrate. Instead, the CdS is formed along the growth surface in a replacement reaction. Further, with the Group II element bound in complexes while in solution, there is little or no opportunity for formation of undesirable precipitates of the metallic ion, e.g., $Cd(OH)_2$ when forming CdS. A feature of the invention is the simultaneous provision of a series of reactions that prevent deposition of the Group II element containing compound by precipitation and allow formation of the Group II element containing intermediary compound bound along the substrate surface prior to formation of the II-VI compound.

To facilitate selective growth of the II-VI film by the aforedescribed replacement technique, the following conditions are believed to be useful:

a. The substrate is maintained at a temperature ranging between 100 to 200° C., depending on the substrate, preferably 170° C. for a glass substrate.

b. The solution is periodically replenished over the growth area with an injection which washes away solution which has been present. The interval time for injecting fresh solution over a substrate surface in the illustrated chamber may range from 10 to 30 seconds, with 20 seconds having been preferred in some experiments.

c. The volume of the injected solution may be one to two times the volume of the solution being replaced e.g., for the 5×5 cm substrate having an overlying solution volume of about 3 ml and the replenishing solution is at least 3 ml uniformly dispensed into the bath to displace the spent solution.

d. The reactions which might otherwise form precipitates and lead to deposition on surfaces other than that of the substrate are limited by cooling the outer part of the heater assembly and the washed solution, e.g., the outer part of the heater assembly outside the reaction bath area may be continuously or intermittently cooled with the relatively cold solution flowing from the reservoir. As this solution accumulates at the bottom of the chamber, it is pumped back into the solution reservoir for further cooling and recirculation. For the 5×5 cm substrate in the film growth system, the flow rate of this solution may be about 120 ml/min.

The exemplary process described above was specifically directed to the growth of CdS films. It will be appreciated that many other useful film compositions can benefit from the inventive apparatus and method. The following table presents the reagent formulations that Applicant has found suitable for creating films of InOSe, InOS, CuS, MnO, LiMnO, CdO, ZnO, CdS, Cu, CdAlSSe, ZnS, and CdAlS. In each case it can be seen that multiple ligands are combined in order to achieve a bath solution that exhibits a desired combination of stability when cool with ease of reaction when warmed adjacent to the substrate. This combination cannot be achieved with a single ligand or "complexing agent" as taught, for example, by McCandless et al '845.

| | Concentration | Remarks/Comment |
|---|---|---|
| InOSe | | |
| $InCl_3$ | 0.002M | |
| Acetic acid | 0.04M | Ligand |
| Selenourea | 0.08M | Ligand and source of Se |
| Hydrogen peroxide | 2.4M | |
| InOS | | |
| $InCl_3$ | 0.002M | |
| Acetic acid | 0.04M | Ligand |
| Thiourea | 0.08M | Ligand and source of S |
| Hydrogen peroxide | 2.4M | |
| CuS | | |
| $CuSO_4$ | 0.005M | |
| Triethanolamine | 0.09M | Ligand |
| Citric Acid | 0.125M | Ligand |
| Potassium nitrilotriacetate | 0.03M | Ligand |
| Thioacetamide | 0.008M | Ligand and source of S |
| MnO | | |
| $MnCl_2$ | 0.002M | |
| Sodium citrate | 0.008M | Ligand |
| Potassium nitrilotriacetate | 0.01M | Ligand |
| Ammonium hydroxide | 0.6M | Ligand and source of O |
| LiMnO | | |
| $MnCl_2$ | 0.0016M | |
| LiCl | 00004M | |
| Sodium citrate | 0.008M | Ligand |
| Potassium nitrilotriacetate | 0.01M | Ligand |
| Ammonium hydroxide | 0.6M | Ligand and source of O |
| CdO | | |
| $CdCl_2$ | 0.002M | |
| Sodium citrate | 0.0056M | Ligand |
| Ammonium hydroxide | 0.77M | Ligand |
| Potassium nitrilotriacetate | 0.0009M | Ligand |
| Hydrogen peroxide | 3.6M | |
| ZnO | | |
| $Zn(NO_3)_2$ | 0.0036M | |
| Sodium citrate | 0.006M | Ligand |
| Ammonium hydroxide | 0.77M | Ligand |
| Potassium nitrilotriacetate | 0.0009M | Ligand |
| Hydrogen peroxide | 3.6M | |
| CdS | | |
| $CdCl_2$ | 0.0015M | source of Cd and Cl (another ligand) |
| Ammonium chloride | 0.006M | Ligand buffer |
| Ammonium hydroxide | 0.77M | Ligand |
| Potassium nitrilotriacetate | 0.0009M | Ligand |
| Thiourea | 0.003M | |
| Cu | | |
| $CuSO_4 \cdot 5H_2O$ | 0.0096M | |
| Hydantoin | 0.107M | Ligand |
| Citric Acid | 0.004M | Ligand |
| Potassium nitrilotriacetate | 0.05M | Ligand |
| Hydrazine | 1.6M | |
| Potassium hydroxide | 0.22M | |
| CdAlSSe | | |
| $CdCl_2$ | 0.001M | |
| $Al(NO_3)_3$ | 0.001M | |
| Sodium citrate | 0.008M | Ligand |
| Ammonium hydroxide | 0.6M | Ligand |
| Potassium nitrilotriacetate | 0.0009M | Ligand |
| Thiourea | 0.004M | |
| Sodium selenosulfite | 0.004M | |
| ZnS | | |
| Zinc Acetate | 0.004M | source of Zn and acetate (another Ligand) |
| Sodium citrate | 0.0008M | Ligand |
| Thioacetamide | 0.004M | Ligand and source of S |

-continued

|  | Concentration | Remarks/Comment |
|---|---|---|
| CdAlS | | |
| $CdCl_2$ | 0.001M | |
| $Al(NO_3)_3$ | 0.001M | |
| Sodium citrate | 0.008M | Ligand |
| Ammonium hydroxide | 0.6M | Ligand |
| Potassium nitrilotriacetate | 0.0009M | Ligand |
| Thiourea | 0.004M | |

For some applications, the films deposited by the chemical method outlined above are typically subject to a heat treatment or annealing step to develop the desired microstructure, crystallinity, and other properties for particular applications. Those skilled in the art will appreciate that the preferred heat treatment will depend on several factors such as the compound being formed and the type of substrate. The following table presents some typical heat treatments, and the skilled artisan can easily adapt these results to other systems with routine experimentation.

Exemplary heat treatments in the tube furnace:

| Coating | Substrate | Anneal T (° C.) | Time (min) | Atmosphere |
|---|---|---|---|---|
| CdS | glass | 300 | 60 | Ar |
| ZnO | glass | 400 | 60 | Ar |
| CdAlS | glass | 275 | 60 | Ar |
| CdO | glass | 400 | 60 | Ar |

It will be appreciated that heat treatment may be carried out using any suitable means, including but not limited to convective, conductive, radiative (including flash lamp, laser, and/or IR heating) and microwave or RF heating. In some cases, microwave heating may be faster than convective or conductive heating, for example. Radiative methods may be used when it is desirable to apply heat quickly to the film while minimizing heating of the substrate, for instance when the substrate is a polymeric material. Conductive heating may be desirable when the substrate is metallic and is therefore a good thermal conductor. Through routine experimentation the skilled artisan can therefore select the optimal heat treatment method for a particular combination of film and substrate.

Materials made by the inventive process display several improvements in useful properties. One accepted method for assessing the adherence of a film is the simple adhesive-tape test. This test was performed on the CdS films deposited on glass by the traditional CBD and the one deposited by the current invention with no post deposition annealing. After three repetitions, the film deposited by the traditional CBD was successfully removed, whereas the film grown by the current invention still remained intact after twenty repetitions.

Figure 10:
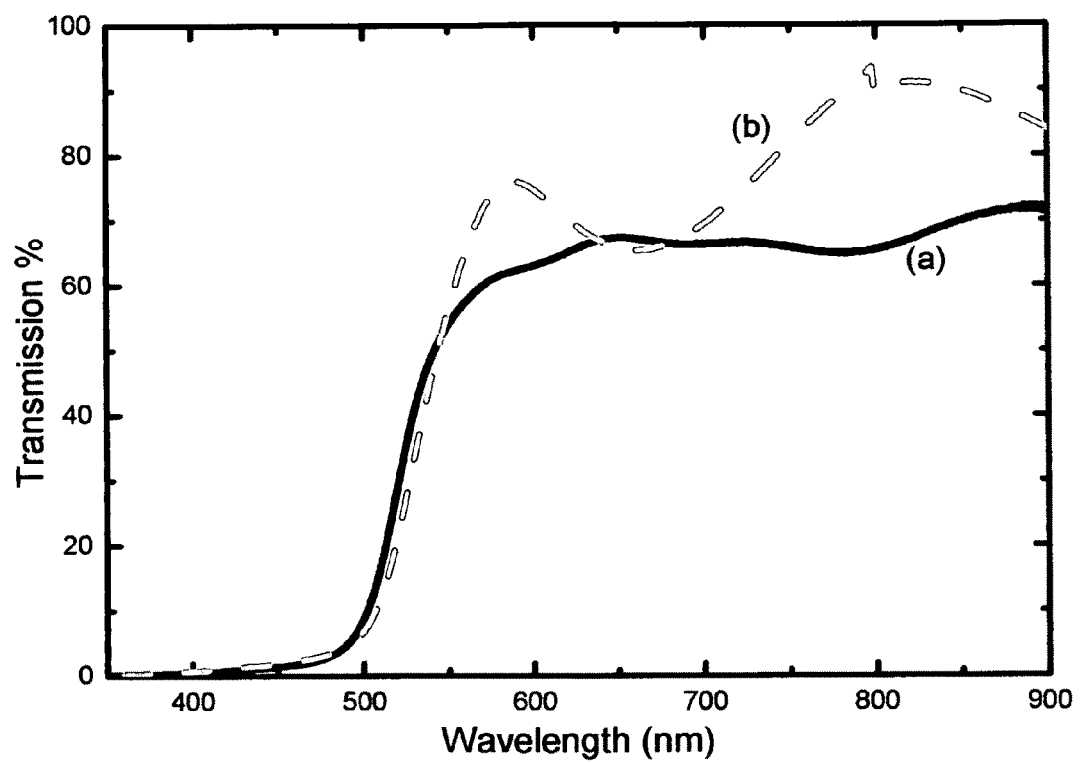
FIG. 10 compares the transmission spectra of CdS films grown by traditional CBD and by the present invention.

FIG. 10 shows the transmission spectrum of CdS film grown by (a) the traditional CBD and (b) the present invention. Here, the film of the current invention is found to be optically superior to that of the traditional CBD. CdS thin film is generally used as a window material in solar cell application and the high optical transmission is essential; therefore, the use of CdS grown by the inventive method will be expected to improve solar cell performance.

Chemical Recycling

Spent solution can be reused in the coating process by replenishing the aqueous solution with depleted reactants. It will be appreciated that after several cycles of replacing depleted reactants, there may be a high build-up of undesirable by-products, rendering the solution unsuitable for high quality film growth. As a result, the remaining quantity of Group II metal, e.g., Cd, could be precipitated out of the solution in the form of CdS by adding excess KOH, $(NH_2)CS$ to the solution and heating the solution to about 90° C. The CdS precipitate can then be filtered out of the mixture and washed. Next, the CdS precipitate can be dissolved in HCl according to the equation $$CdS + HCl \rightarrow CdCl_2 + H_2S \uparrow$$

The process is performed under a ventilation hood in the presence of a carbon filter which will absorb essentially all of the $H_2S$ gas. The $CdCl_2$ solution may then be purified, recrystallized, and dried for reuse.

Doping of Compound Semiconductor Material During Film Growth

In lieu of forming intrinsic CdS as described above, e.g., creating the CdS on a hydrophilic substrate surface, the intrinsic film can be doped in-situ by replacing less than 1% concentration of the matrix salt with the appropriate dopant salt. For n-type doping the dopant salt cation needs to be a group III ion and for p-type doping the dopant salt cation needs to be a group I ion. Alternately, ex-situ doping of the intrinsic film can be achieved by ion-implantation of group III ions for n-type conductivity and group V ions, preferably nitrogen ions, for p-type doping. Ex-situ doping can also be achieved in a FGS by flowing a low concentration of a dopant solution on the substrate with the intrinsic film subjected to a temperature ranging between 80 to 250° C. The following salts may be used to provide dopants:

Group III salt of interest: $AlCl_3$, $GaSO_4$, $InCl_3$, etc.

Group I salt of interest: $AgNO_3$, $KNO_3$, $LiNO_3$.

The invention may be used to form multiple layers of material including p-n semiconductor junctions. A second exemplary film that may be formed over CdS is CdSe. An exemplary processing solution for such film formation is as follows:

| $CdCl_2$ | 0.0023M |
|---|---|
| Ammonium chloride ($NH_4Cl$) | 0.005M |
| Ammonium hydroxide ($NH_4OH$) | 0.60M |
| Potassium nitrilotriacetate (NTA or $N(CH_2OOK)_3$) | 0.0009M |
| $Na_2SeSO_3$ | 0.007M |
| $Na_2SO_3$ | 0.004M |

It will be understood by those familiar with chemical processing that in numerous applications such as manufacture of solar cells numerous other layers may be deposited on a substrate and a variety of cleans will be performed as intermediate and pre- and post-processing steps.

Although numerous embodiments of the invention have been illustrated and described, the invention is not so limited. Numerous modifications, variations, substitutions and equivalents will occur to those skilled in the art without departing from the spirit and scope of the present invention.

I claim:

1. An apparatus for depositing a solid film onto a substrate from an aqueous reagent solution comprising:
   a reservoir of said aqueous reagent solution maintained at a first temperature at which homogeneous reactions are substantially inhibited within said reagent solution, said reagent solution further containing at least two ligands;
   a fluid dispenser configured to dispense a controlled, intermittent flow of said reagent solution at said first temperature;
   a substrate holder configured to hold said substrate in a position to receive at least a portion of said controlled flow of said reagent over a selected area of said substrate, said substrate holder further including a raised structure peripheral to said selected area whereby a controlled volume of said reagent solution may be maintained upon said substrate and periodically replenished at a selected rate; and,
   a heater disposed beneath said substrate, said heater configured to maintain said substrate at a second temperature, higher than said first temperature, at which the deposition of a desired solid phase from said reagent solution may be initiated.

2. The apparatus of claim 1 wherein said second temperature is at least 60° C. higher than said first temperature.

3. The apparatus of claim 1 wherein said fluid dispenser is configured to dispense a first portion of said reagent solution into said controlled volume defined by said raised peripheral structure and to dispense a second portion of said reagent solution outside of said controlled volume.

4. The apparatus of claim 3 wherein said second portion of said reagent solution impinges on selected components of said apparatus whereby said components may be cooled by said solution.

5. The apparatus of claim 1 further comprising a process chamber containing said fluid dispensing assembly, said substrate holder, and said heater.

6. The apparatus of claim 5 wherein at least a portion of said reagent solution follows a recirculating path between said process chamber and said reagent solution reservoir.

7. The apparatus of claim 6 wherein said reagent solution reservoir includes a device selected from the group consisting of: temperature sensors, pH meters, chemical sensors, liquid level control switches, and chillers.

8. The apparatus of claim 6 wherein said recirculating path includes a device selected from the group consisting of: pumps; valves; filters; pressure gauges; and return line reservoirs.

9. The apparatus of claim 5 wherein said process chamber may be maintained at a selected pressure.

10. The apparatus of claim 1 wherein said fluid dispenser comprises a plate having a plurality of openings through which said fluid is dispensed.

11. The apparatus of claim 1 wherein said fluid dispenser comprises a plurality of capillary tubes with microswitch valves through which said fluid is dispensed.

12. An apparatus for forming semiconductor material films comprising:
    a processing chamber including a fluid dispenser configured to intermittently supply a uniform flow of reagent solution containing at least two ligands onto a selected area of the surface of a substrate positioned on a substrate holder assembly including a temperature-controlled platen configured to effect a temperature-dependent reaction at said substrate surface, said substrate holder assembly further comprising a raised structure peripheral to said selected area whereby a controlled volume of said reagent solution may be maintained upon said substrate and periodically replenished at a selected rate;
    a temperature-controlled process solution reservoir wherein said reagent solution may be held at a sufficiently low temperature to inhibit homogeneous reactions; and,
    a delivery system configured to supply a controlled flow of said reagent solution through said fluid dispenser to said substrate surface whereon said temperature-dependent reaction forms said semiconductor film.

13. The apparatus of claim 12 wherein said semiconductor film is selected from the group consisting of: InOSe; InOS; CuS; MnO; CdO; ZnO; CdS; CdAlSSe; ZnS; and CdAlS.

* * * * *